United States Patent
Chou et al.

(10) Patent No.: US 7,876,554 B2
(45) Date of Patent: Jan. 25, 2011

(54) NOTEBOOK COMPUTER

(75) Inventors: Mei-Fang Chou, Taipei (TW); Lung-Fei Chiang, Taipei (TW); Pao-Tung Weng, Taipei (TW)

(73) Assignee: ASUSTeK Computer, Inc., Taipei (TW)

( * ) Notice: Subject to any disclaimer, the term of this patent is extended or adjusted under 35 U.S.C. 154(b) by 102 days.

(21) Appl. No.: 12/414,869

(22) Filed: Mar. 31, 2009

(65) Prior Publication Data

US 2009/0296337 A1 Dec. 3, 2009

(30) Foreign Application Priority Data

May 27, 2008 (TW) ............................... 97119561 A

(51) Int. Cl.
*G06F 1/16* (2006.01)
(52) U.S. Cl. .................. 361/679.28; 248/65; 40/601; 349/156; 455/418; 715/753
(58) Field of Classification Search ............... 349/156, 349/58, 106, 124; 248/65, 200, 917; 40/601, 40/308, 642.02; 361/679.04, 679.22, 679.21, 361/679.26, 679.27; 211/59.1; 345/213, 345/92, 178; 455/566, 418, 456.3; 715/773, 715/753, 702, 781, 765, 804

See application file for complete search history.

(56) References Cited

U.S. PATENT DOCUMENTS

| 6,778,383 | B2 * | 8/2004 | Ho ......................... 361/679.04 |
| 6,903,927 | B2 | 6/2005 | Anlauff |
| 7,549,246 | B2 * | 6/2009 | Kuo ............................. 40/601 |
| 2005/0012889 | A1 * | 1/2005 | Ishii et al. ................... 349/156 |
| 2009/0294599 | A1 * | 12/2009 | Chen et al. ..................... 248/65 |

* cited by examiner

*Primary Examiner*—Hung V Duong
(74) *Attorney, Agent, or Firm*—Muncy, Geissler, Olds & Lowe, PLLC

(57) ABSTRACT

A notebook computer includes a host, a supporting frame and a display portion. The supporting frame is pivotally connected with the host and comprising a sliding slot. The display portion has a sliding member, which is pivotally connected with the supporting frame and slidably connected with the sliding slot, wherein the sliding member comprises a through hole. The signal cable is led through the through hole and extended within the supporting frame to electrically couple the display portion and the host. The signal cable comprises a bendable section. The signal cable is moved substantially along a plane by adjusting a bent angle of the bendable section when the display portion is slid along the sliding slot.

9 Claims, 8 Drawing Sheets

NOTEBOOK COMPUTER

RELATED APPLICATIONS

This application claims priority to Taiwan Application Serial Number 97119561, filed May 27, 2008, which are herein incorporated by reference.

BACKGROUND

1. Field of Invention

The present invention relates to a computer device, and more particularly, to a notebook computer.

2. Description of Related Art

Notebook computers are very popular in the market in recent years and have become a mainstream in the computer market. The notebook computer equipped with a wide screen is another mainstream in the computer market. The wide screen is conventionally connected with a host by a landscape way, i.e. the wide screen has a relatively long edge pivotally connected with the host. The wide screen in landscape mode is beneficial for displaying movies, but has few benefits for browsing web pages or editing articles or programs, and increases a using rate of a computer mouse. For the foregoing reasons, there is a need for improving a notebook computer to satisfy both demands of the screen in landscape mode and in portrait mode.

SUMMARY

It is therefore an objective of the present invention to provide a portable computer equipped with a display portion switchable between a landscape mode and portrait mode, and a proper signal cable layout for the rotatable display portion.

In accordance with the foregoing and other objectives of the present invention, a notebook computer includes a host, a supporting frame and a display portion. The supporting frame is pivotally connected with the host and comprising a sliding slot. The display portion has a sliding member, which is pivotally connected with the supporting frame and slidably connected with the sliding slot, wherein the sliding member comprises a through hole. The signal cable is led through the through hole and extended within the supporting frame to electrically couple the display portion and the host. The signal cable comprises a bendable section. The signal cable is moved substantially along a plane by adjusting a bent angle of the bendable section when the display portion is slid along the sliding slot.

Thus, the present invention provides a notebook computer, which is equipped with a display portion readily switchable between the portrait mode and the landscape mode for performing preferable functionalities. In addition, the signal cables extended within the supporting frame would not be intertwined or rubbed against each other when the display portion is rotated relative to the supporting frame.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIGS. 6A and 6A respectively illustrate two cross-sectional views of a signal cable taken along line B-B' and line C-C' in FIG. 6.

DESCRIPTION OF THE PREFERRED EMBODIMENTS

Figure 1:
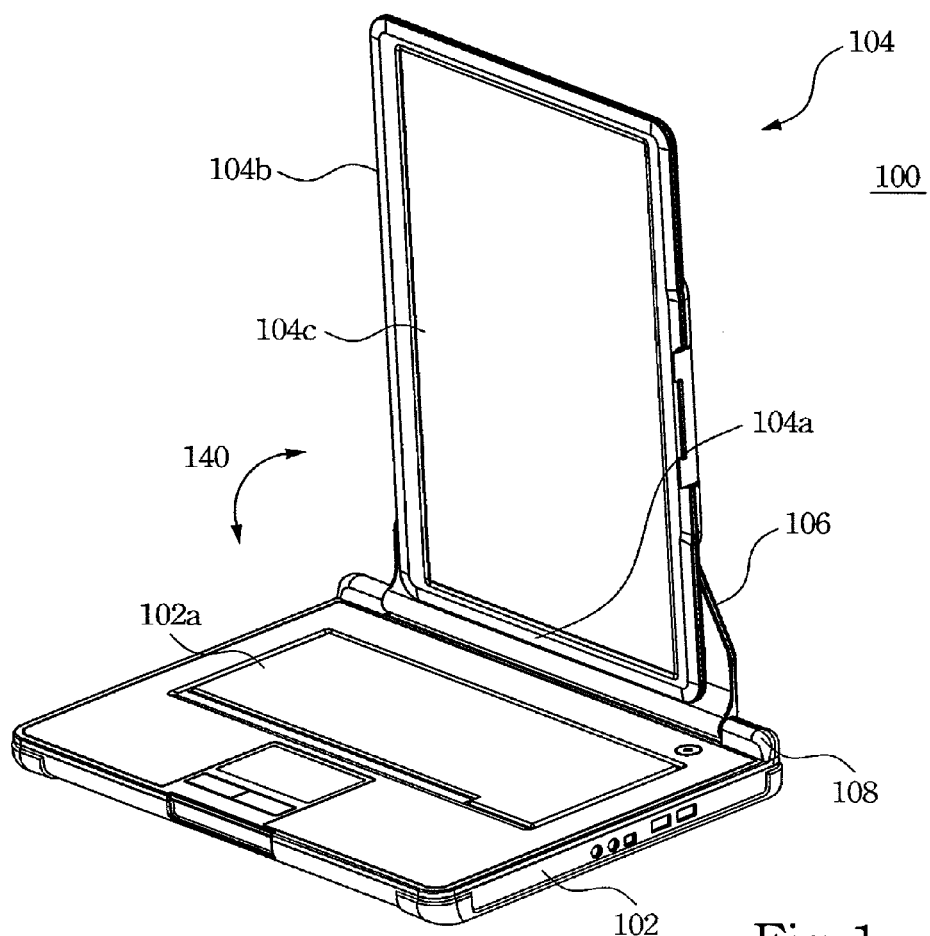
FIG. 1 illustrates a notebook computer according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
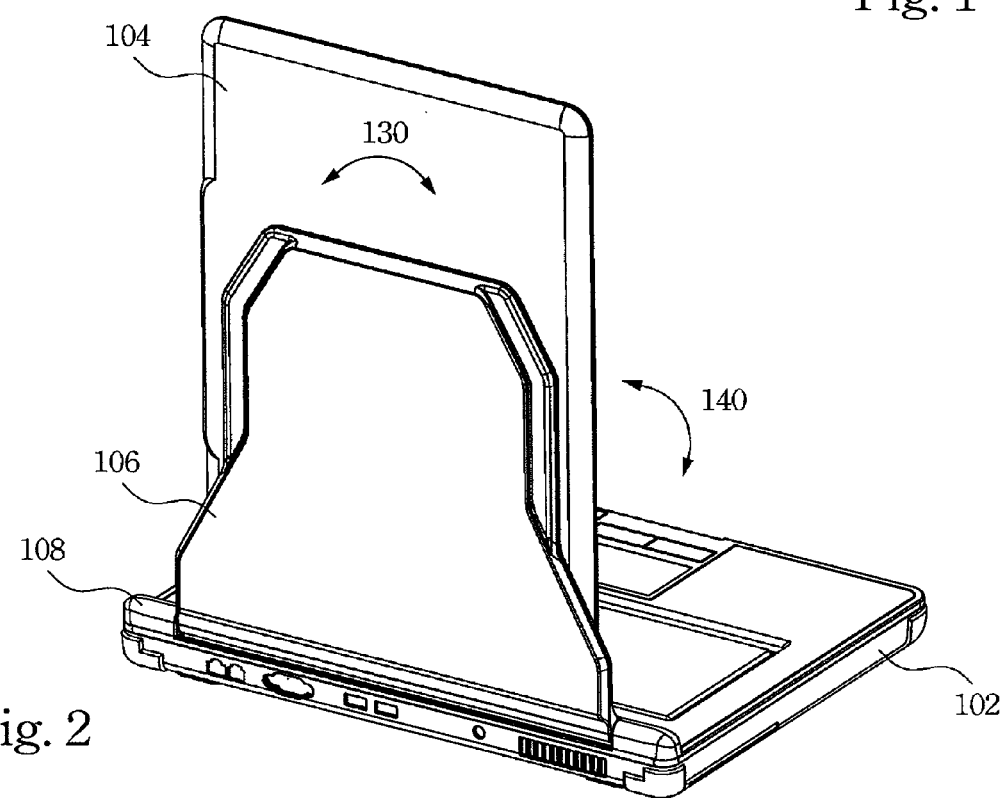
FIG. 2 illustrates another view of the notebook computer in FIG. 1.

FIG. 1 illustrates a notebook computer according to one preferred embodiment of this invention. FIG. 2 illustrates another view of the notebook computer in FIG. 1. The notebook computer 100 includes a host 102, a display portion 104 and a supporting frame 106. The supporting frame 106 is pivotally connected with an edge of the host 102 while the display portion 104 is pivotally connected with the supporting frame 106. Therefore, the display portion 104 can be swiveled relative to the host 102 along a direction 140, by the supporting frame 106, to selectively lay against the host 102 or form an included angle between the host 102 and the display portion 104. The host 102 has a keyboard 102a while the display portion 104 has a display screen 104a. When the display portion 104 is laid against the host 102, the display screen 104a is laid against the keyboard 102a. The notebook computer 100 is equipped with a rotatable display portion 104. The display portion 104 can be rotated relative to the supporting frame 106 along a direction 130 to be selectively in landscape mode (i.e., the display portion 104 with a relatively long edge adjacent to the host 102) or in portrait mode (see the display portion 104 with a relatively short edge adjacent to the host 102 in FIGS. 1 and 2). The display portion 104 in landscape mode and in portrait mode is preferable for performing different functionalities. For example, the display portion 104 in landscape mode is preferable for displaying movies while the display portion 104 in portrait mode is preferable for browsing web pages or editing articles or programs. How the display portion 104 being switchable between the landscape mode and the portrait mode is described.

Figure 3:
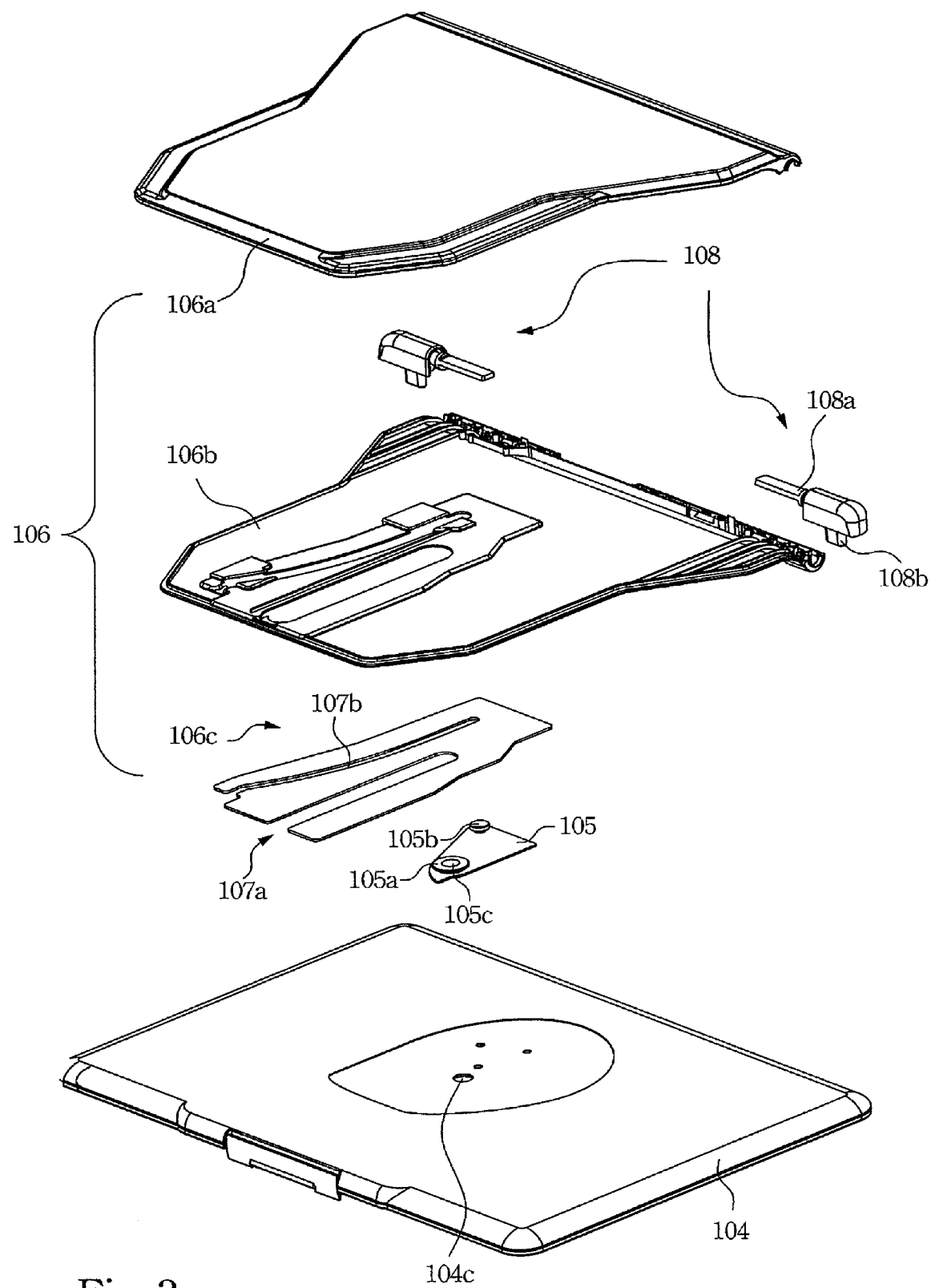
FIG. 3 illustrates an exploded view of the display portion and the supporting frame.

FIG. 3 illustrates an exploded view of the display portion and the supporting frame. The supporting frame 106 includes an upper housing wall 106a, a lower housing wall 106b and a connection bracket 106c. The supporting frame 106 is pivotally connected with the host 102 by two hinges 108 such that the supporting frame 106 can be swiveled relative to the host 102. Each hinge 108 has a connection end 108a secured between the upper housing wall 106a and the lower housing wall 106b. Each hinge 108 has another connection end 108b secured to the host 102. The connection bracket 106c has a straight sliding slot 107a and a curved sliding slot 107b. The connection bracket 106c is attached to a bottom side of the lower housing wall 106b when all parts of the supporting frame 106 are assembled. A connection member 105 is assembled to the connection bracket 106c by respectively engaging two sliding members (105a; 105b) into two sliding slots (107a; 107b) from their lateral openings. The connection member 105 is attached to a top side of the display portion 104, and a through hole 105c is aligned with an opening 104c on the display portion 104. The sliding member 105a is located in a central area of the display portion 104. All those parts (except the upper housing wall 106a) in FIG. 3 are put together to form an assembled status as illustrated in FIG. 4.

Figure 4:
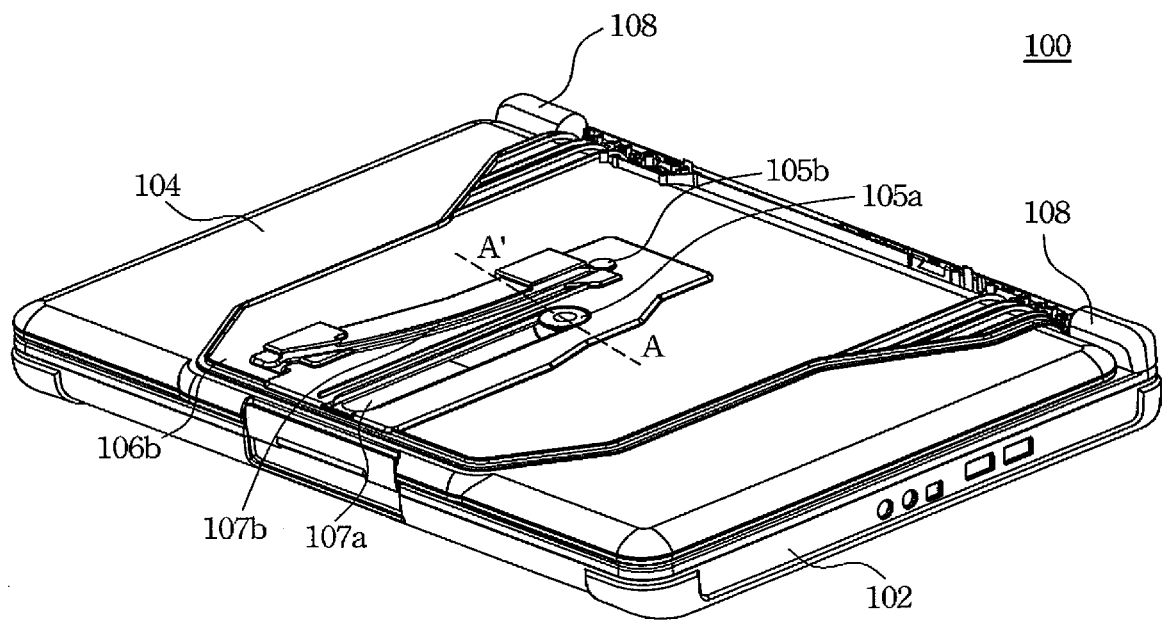
FIG. 4 illustrates a notebook computer with an upper housing wall of the supporting frame removed according to one preferred embodiment of this invention.
Figure 5:
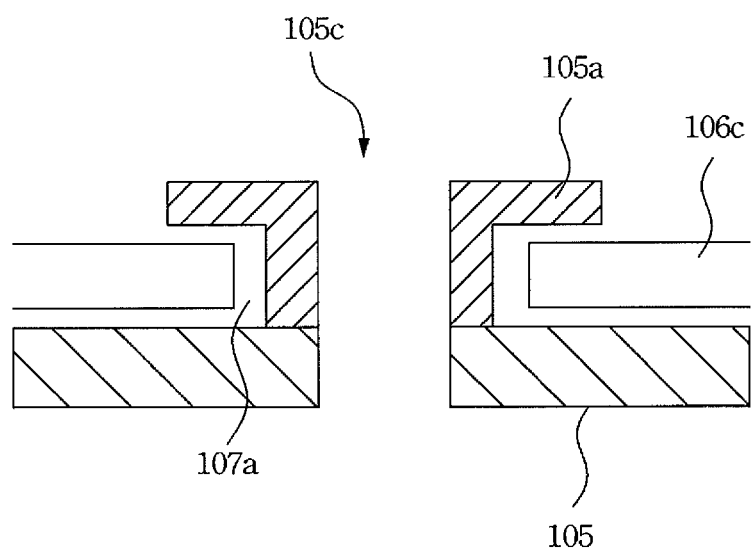
FIG. 5 illustrates a cross-sectional view of a sliding member engaging a sliding slot taken along line A-A' in FIG. 4.

FIG. 5 illustrates a cross-sectional view of a sliding member engaging a sliding slot taken along line A-A' in FIG. 4. In this embodiment, the sliding member 105a has a through hole 105c, through which a signal cable can be led. In an alternate embodiment (not illustrated in drawings), the sliding member 105b may have a through hole for the same purpose.

Figure 7:
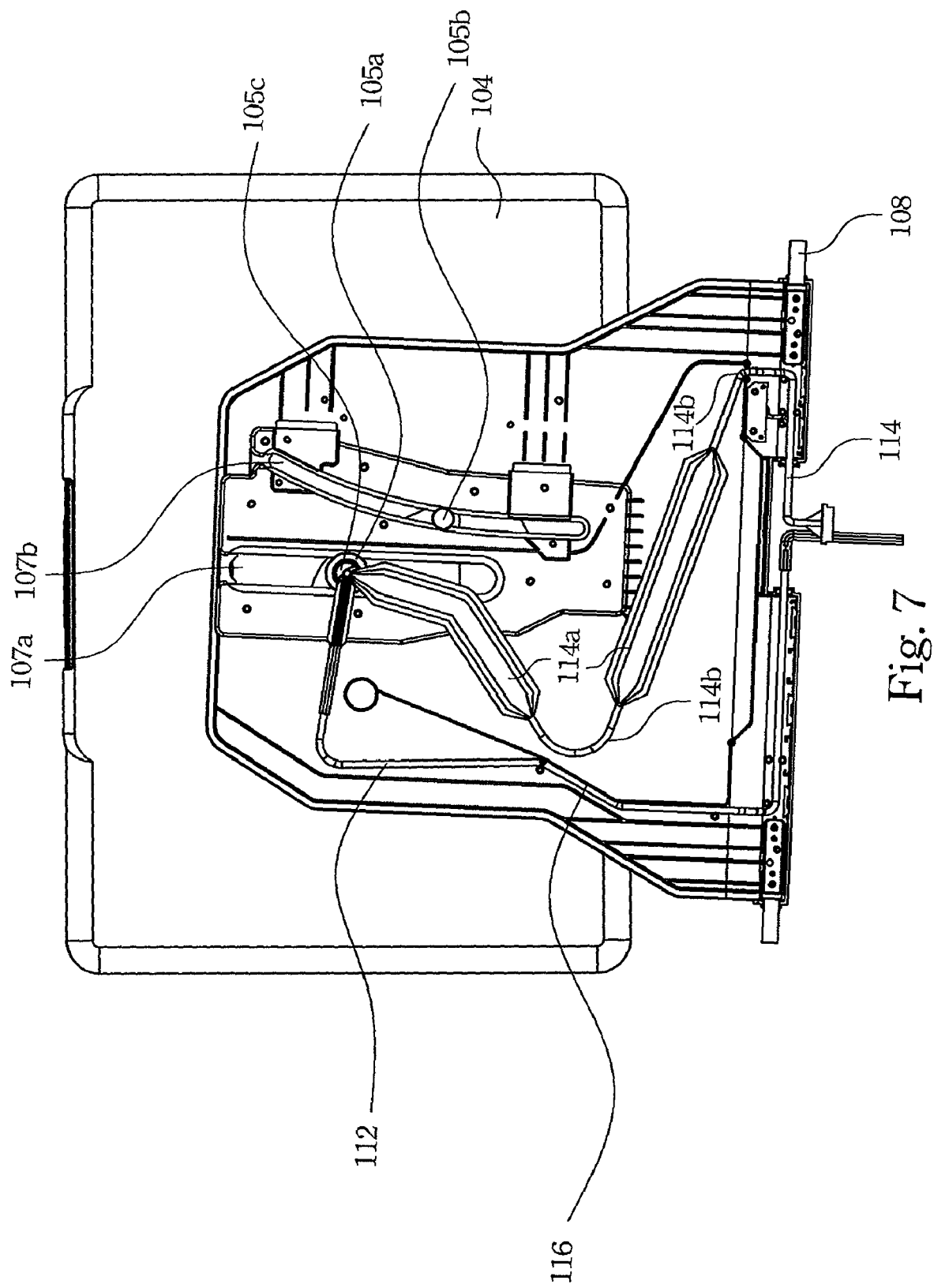
Figure 8:
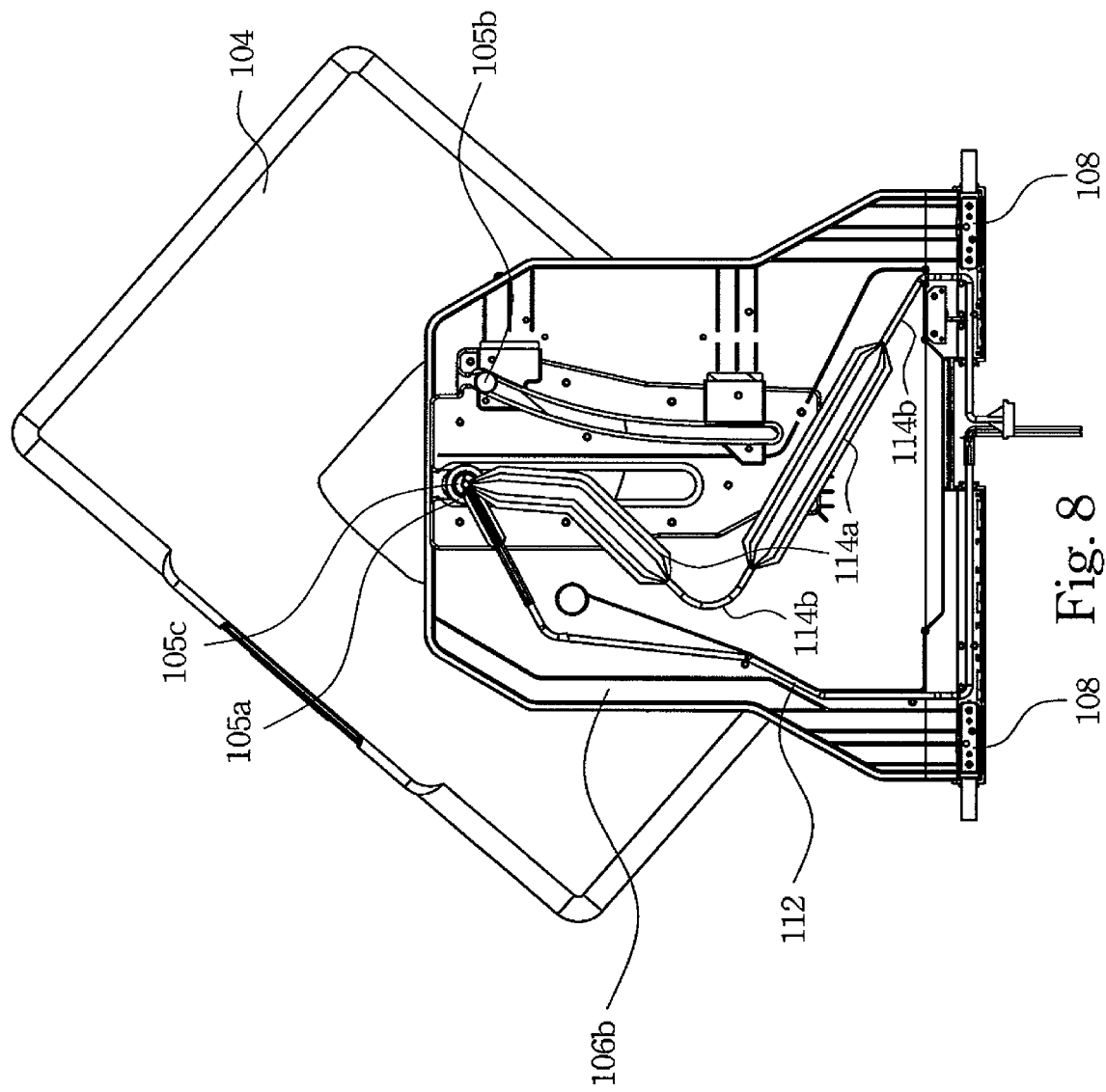
Figure 9:
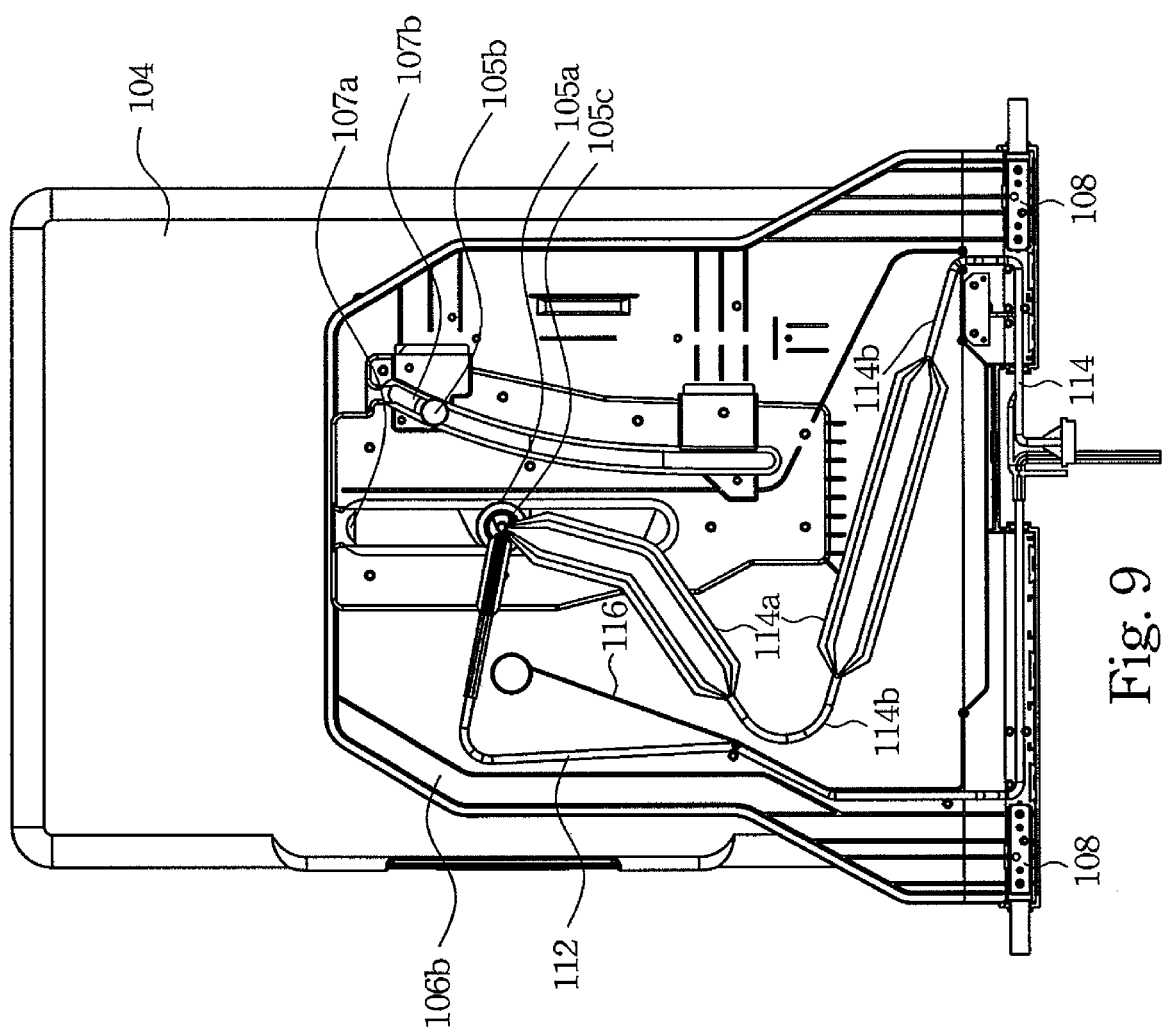

FIGS. 6-9 illustrate a series of views to show the signal cables' status from the display portion in landscape mode (see FIG. 6) rotating to the display portion in portrait mode (see FIG. 9). In those drawings, the upper housing wall 106a is removed for clearly illustrating the parts therein. Signal cables (112; 114) are extended within the supporting frame 106, i.e. between the two housing walls (106a, 106b). Both signal cables (112; 114) have one end led through the through hole 105c and coupled to the display portion 104 and the other end led through an opening 118 and coupled to the host 102. The opening 118 is located between two hinges 108. The signal cables (112; 114) both include a plurality of cables wrapped together, wherein the signal cable 114 includes two types of sections: a flat section 114a and a bendable section 114b. FIG. 6A illustrate a cross-sectional view of the flat section 114a. All cables within the section 114a are arranged along a plane. FIG. 6B illustrate a cross-sectional view of the bendable section 114b. All cables within the section 114b are wrapped up tightly to be easily bent.

Figure 6:
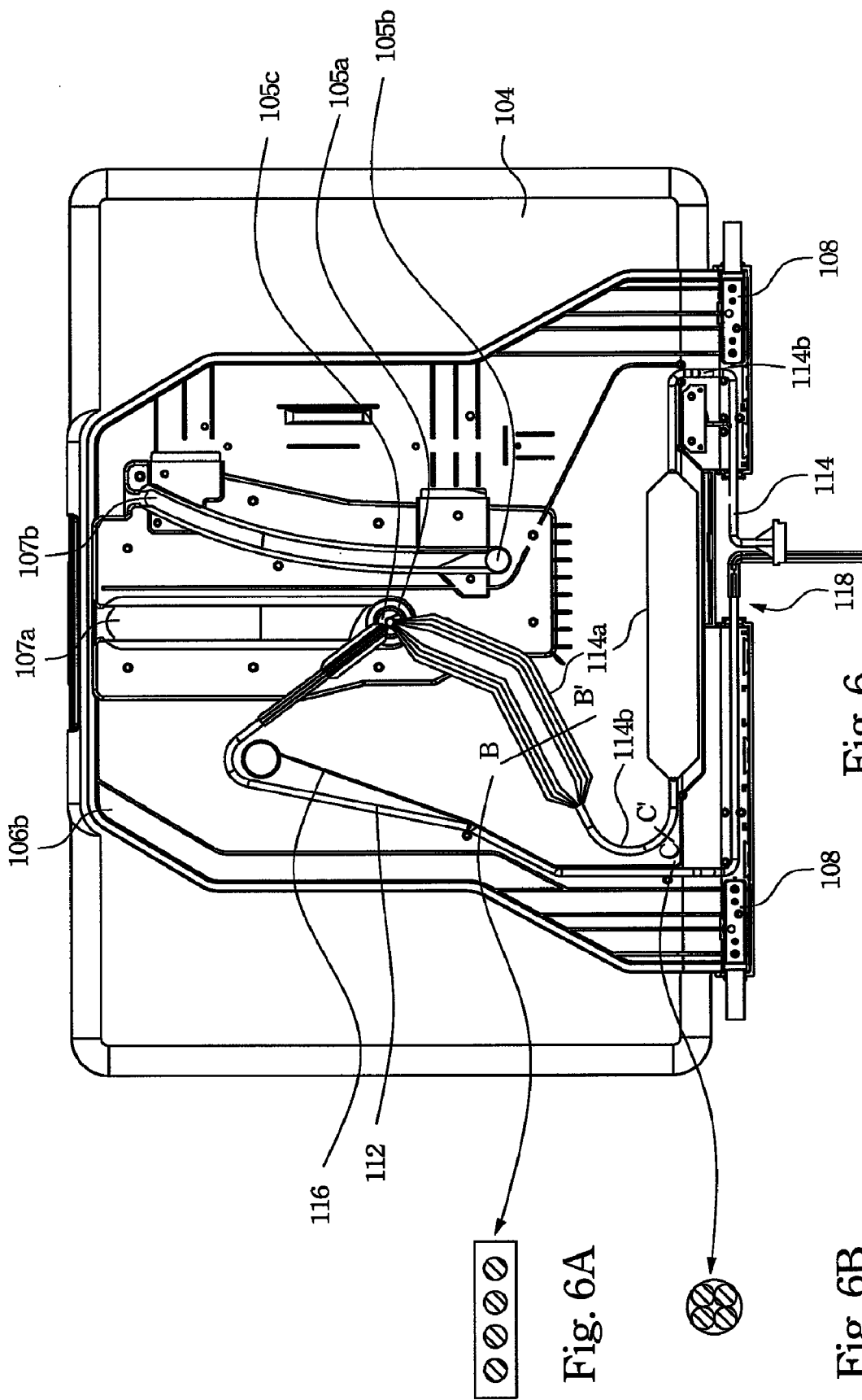
FIGS. 6-9 illustrate a series of views to show the signal cables' status from the display portion in landscape mode (see FIG. 6) rotating to the display portion in portrait mode (see FIG. 9)

Referring to FIG. 6, the display portion 104 is in landscape mode. In this case, the connection member 105 is located at the bottom ends of the two sliding slots (107a; 107b).

Referring to FIG. 7, the connection member 105 is being slid upwards along with the display portion 104, and the upper ends of the signal cables (112; 114) are simultaneously carried upwards along.

Referring to FIG. 8, the connection member 105 is being rotated relative to the supporting frame 106. In this case, the connection member 105 has the two sliding members (105a; 105b) slid and rotated relative to the two suspending ribs (107c; 107d) as if the connection member 105 is pivotally connected with the supporting frame 106.

Referring to FIG. 9, the display portion 104 is in portrait mode.

The bendable section 114b has a bent angle varying along with the connection member 105, which is located differently in FIGS. 6-9, such that the signal cable 114 can be moved substantially along a plane.

An isolation wall 116 may be installed between the signal cables (112; 114) so as to prevent the signal cables from intertwining or rubbing against each other. In case the isolation wall 116 is made from metallic materials and grounded, an EMI shielding can also be established between two signal cables (112; 114). In this embodiment, the signal cable 114 is a cable transmitting antenna signals or other RF signals while the signal cable 112 is a cable transmitting video signals and power signals.

Figure 10:
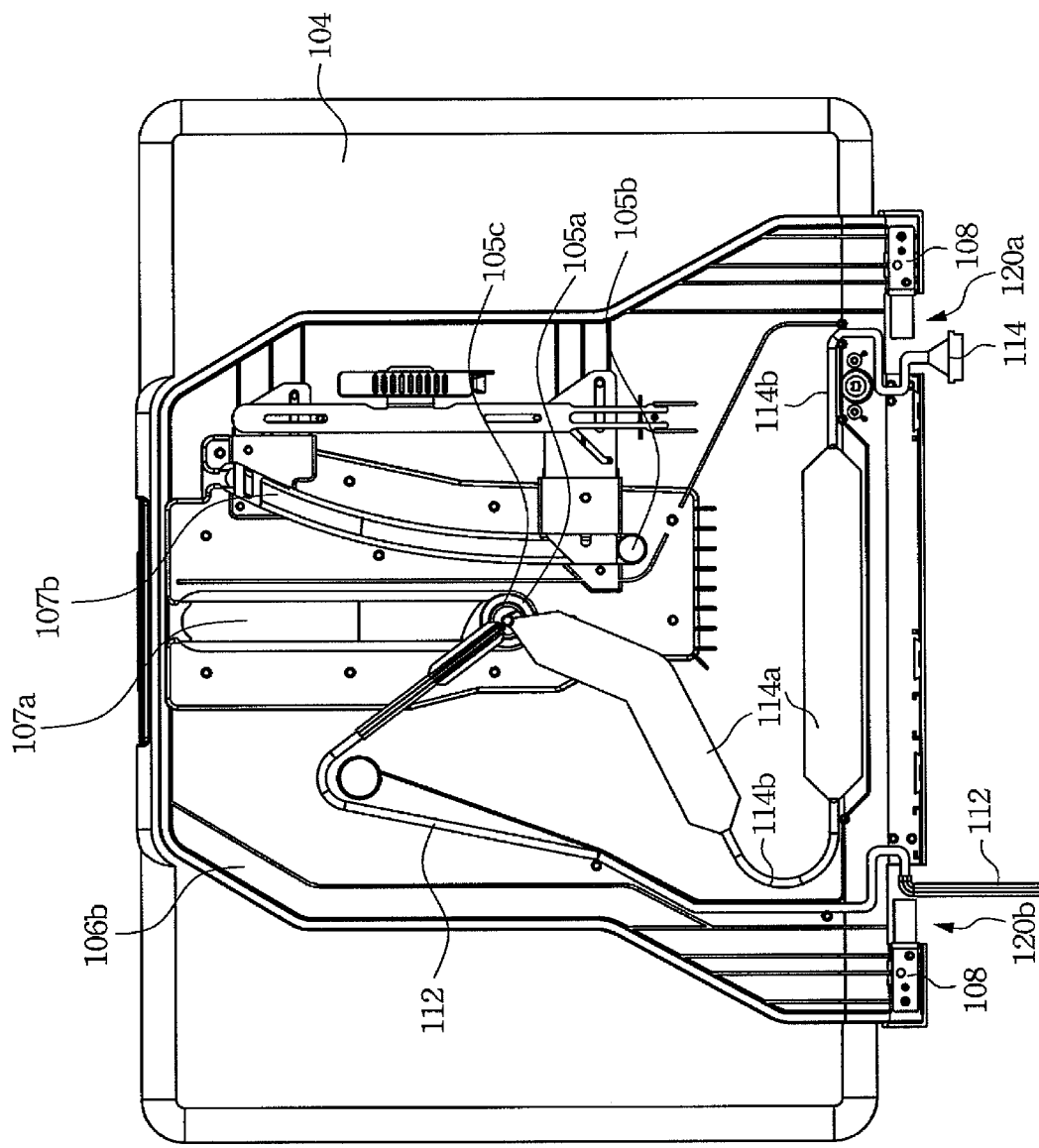
FIG. 10 illustrates another signal cable layout according to another preferred embodiment of this invention.

FIG. 10 illustrates another signal cable layout according to another preferred embodiment of this invention. The difference between this embodiment and other embodiments as illustrated in FIGS. 6-9 lies in signal cable layout. In this embodiment, the two signal cables (112; 114) are respectively routed through an opening 120b and an opening 120a and then coupled to the host 102. The two openings (120a; 120b) are located between the two hinges 108.

The terms "substantially" as used herein may be applied to modify any quantitative representation which could permissibly vary without resulting in a change in the basic function to which it is related.

According to discussed embodiments, the present invention provides a notebook computer, which is equipped with a display portion readily switchable between the portrait mode and the landscape mode for performing preferable functionalities. In addition, the signal cables extended within the supporting frame would not be intertwined or rubbed against each other when the display portion is rotated relative to the supporting frame.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A notebook computer, comprising:
   a host;
   a supporting frame being pivotally connected with the host and comprising a sliding slot;
   a display portion having a sliding member, which is pivotally connected with the supporting frame and slidably connected with the sliding slot, wherein the sliding member comprises a through hole; and
   a signal cable being led through the through hole and extended within the supporting frame to electrically couple the display portion and the host, wherein the signal cable comprises a bendable section, the signal cable is moved substantially along a plane by adjusting a bent angle of the bendable section when the display portion is slid along the sliding slot.

2. The notebook computer of claim 1, wherein the sliding member is disposed in a central area of the display portion.

3. The notebook computer of claim 1, further comprising a second signal cable led through the through hole and extended within the supporting frame to electrically couple the display portion and the host.

4. The notebook computer of claim 3, wherein the supporting frame comprises an isolation wall disposed between the signal cable and the second signal cable.

5. The notebook computer of claim 3, wherein the supporting frame comprises an opening, through which the signal cable and the second signal cable are led to couple with the host.

6. The notebook computer of claim 5, further comprising a pair of hinges to pivotally interconnect the supporting frame and the host, the opening is disposed between the pair of hinges.

7. The notebook computer of claim 3, wherein the supporting frame comprises two openings, through which the signal cable and the second signal cable are led separately to couple with the host.

8. The notebook computer of claim 7, wherein, further comprising a pair of hinges to pivotally interconnect the supporting frame and the host, the two openings are disposed between the pair of hinges.

9. The notebook computer of claim 3, wherein the signal cable is a cable transmitting antenna signals, the second signal cable is a cable transmitting video signals and power signals.

* * * * *